United States Patent [19]

Thompson

[11] 4,112,147
[45] Sep. 5, 1978

[54] METHOD OF MANUFACTURING A MONOLITHIC CRYSTAL FILTER

[75] Inventor: Edwin C. Thompson, West Epping, N.H.

[73] Assignee: Western Electric Company, Inc., New York, N.Y.

[21] Appl. No.: 796,625

[22] Filed: May 13, 1977

[51] Int. Cl.² .......................... H03H 3/02; H03H 3/04
[52] U.S. Cl. ..................................... 427/100; 29/25.35; 310/320; 333/72; 427/8; 427/10; 427/58
[58] Field of Search ....................... 427/58, 100, 10, 8; 333/72; 310/320; 29/25.35

[56] References Cited

U.S. PATENT DOCUMENTS

| | | | |
|---|---|---|---|
| 3,549,414 | 12/1970 | Curran et al. | 427/100 |
| 3,564,463 | 2/1971 | Beaver et al. | 333/74 |
| 3,573,672 | 4/1971 | Fair et al. | 333/72 |
| 3,760,471 | 9/1973 | Borner | 427/100 |
| 3,864,161 | 2/1975 | Thompson | 427/100 |
| 4,028,647 | 6/1977 | Yee | 333/72 |

Primary Examiner—John D. Smith
Attorney, Agent, or Firm—D. D. Bosben

[57] ABSTRACT

A method of manufacturing a monolithic crystal filter, and particularly a filter having a high midband frequency (e.g., 20 MHz or above) and a wide resonator coupling (e.g., 4 KHz or above), involves the plating of additional electrode material onto a pair of base-plated split electrodes on one side of a crystal wafer to establish a desired coupling between resonators of the filter. Additional electrode material then is plated onto a base-plated solid electrode on the opposite side of the crystal wafer to establish a desired midband frequency of the filter. When the electrodes are plated in this sequence, the resonator coupling decreases substantially during the additional plating of the split electrodes, but remains essentially constant, within tolerance limits, during the plating of the solid electrode, whereby further adjustment of the coupling is not necessary.

10 Claims, 12 Drawing Figures

METHOD OF MANUFACTURING A MONOLITHIC CRYSTAL FILTER

BACKGROUND OF THE INVENTION

1. Field of the Invention

This invention relates to a method of manufacturing a monolithic crystal filter, and more particularly to a method of manufacturing a monolithic crystal filter by plating its electrodes in sequence to establish desired values of resonator coupling and midband frequency in sequence.

2. Description of the Prior Art

The W. D. Beaver et al. U.S. Pat. No. 3,564,463 is directed to a monolithic crystal filter in which two identical pairs of electrodes (e.g., gold) are plated, such as by vapor deposition, onto opposite sides or faces of an AT-cut quartz crystal body or wafer in a process known in the art as mass-loading of the wafer. When one pair of the electrodes is connected to a source capable of exciting thickness shear mode vibrations in the wafer, and when the other pair of electrodes is connected to a resistive load, the electrode pairs form a pair of coupled resonators with the wafer. The coupling between the resonators, and the midband or center frequency of the filter, depend upon a number of factors, such as the degree of mass-loading, electrode separation, electrode dimensions and crystal wafer thickness. The Beaver et al. patent teaches that adjusting of the resonator coupling and the midband frequency can be accomplished by adding mass to the electrodes of the separate resonators to decrease their respective frequencies. However, since this change in mass-loading of the electrodes varies both the resonator coupling and the midband frequency simultaneously, fine control of the resonator coupling and midband frequency is difficult to achieve.

A more accurate procedure for establishing the coupling of the resonators and their midband frequency is disclosed in the I. E. Fair et al. U.S. Pat. No. 3,573,672. This procedure involves plating material in the gap between two of the electrodes on one side of the crystal wafer to increase or widen the coupling between the resonators. At the same time the midband frequency of the resonators decreases, but only by a small percentage of its value, whereby the resultant change is essentially insignificant. When the desired resonator coupling is reached, if the midband frequency is not within desired tolerance limits, additional mass is deposited onto the electrodes of the monolithic crystal filter to shift the midband frequency to the desired value. In this instance, the required shift in midband frequency represents only a small proportionate change in the midband frequency and the proportionate change in the value of the resonator coupling is insignificant.

More specifically, at the present time the manufacture of a monolithic crystal filter as disclosed in the Fair et al. patent involves base-plating the pairs of electrodes on opposite sides of the crystal wafer in apparatus of a known type. Simultaneously with the base-plating of the electrodes on one side of the crystal wafer, a resonator coupling-and-adjusting strip of the electrode material is plated in the gap between the electrodes in spaced relationship to the electrodes to produce a filter device having a resonator coupling greater than the resonator coupling desired. Additional electrode material then is vapor deposited on the electrodes in apparatus of the type disclosed in the E. C. Thompson U.S. Pat. No. 3,864,161, to produce a device having a midband frequency slightly above the desired midband frequency. Subsequently, a portion of the strip between the two electrodes is trimmed from the strip by a laser beam to decrease the resonator coupling to the desired value. In the alternative, additional electrode material may be added to the center strip to further increase the resonator coupling, if this is necessary. After the device has been attached or "floated" to a suitable metal header to complete the filter, additional electrode material is plated onto the electrodes of the filter if necessary, to fine-adjust the filter to the desired midband frequency.

The foregoing system has produced satisfactory results in the manufacture of monolithic crystal filters where the gap required between the split electrodes in order to achieve a desired width of resonator coupling can be greater than 30 mils, whereby the resonator coupling-and-adjusting strip can readily be formed between its associated electrodes in sufficiently spaced relationship with respect thereto. However, the system is not particularly suited for the fabrication of filters in which the gap between the electrodes must be narrowed in order to produce a resonator coupling of increased width. In this connection, in certain high frequency filters of a type having a pair of split electrodes on one side of the crystal wafer and a solid electrode on the opposite side of the crystal wafer, the gap or spacing between the pair of split electrodes may be so narrow (e.g., 5–30 mils) as to make it extremely difficult, and in some instances physically impossible, to fabricate the laser-trimmable resonator coupling-and-adjusting strip between the electrodes with known masking and plating techniques. Accordingly, the use of the above-described system is generally limited to filters having a midband frequency of less than 20 MHz and a resonator coupling less than 4 KHz. The use of the system also requires a significant investment in laser trimming equipment, which is not always practical from an economic standpoint. Accordingly, the purpose of this invention is to provide a new and improved method of fabricating monolithic crystal filters having a desired resonator coupling and midband frequency, without utilizing a laser-trimmable resonator coupling-and-adjusting strip between the pair of split electrodes.

SUMMARY OF THE INVENTION

In general, this invention relates to a method of manufacturing a monolithic crystal filter in which electrode material is base-plated onto opposite sides of a crystal wafer to form a pair of split electrodes on one side of the wafer and a solid electrode on the other side of the wafer in superimposed relationship, to produce a device having an initial resonator coupling greater than a desired resonator coupling and having an initial midband frequency above a desired midband frequency. Additional electrode material then is plated onto the split electrodes to narrow the initial resonator coupling to the desired resonator coupling and to lower the midband frequency of the device from the initial midband frequency to an intermediate midband frequency which is below the initial midband frequency and above the desired midband frequency. Additional electrode material then is plated onto the solid electrode to lower the midband frequency of the device from the intermediate midband frequency to the desired midband frequency. During the additional plating of the solid electrode, the resonator coupling remains essentially constant, within tolerance limits, whereby further adjustment of the resonator coupling is not necessary.

DETAILED DESCRIPTION

Figure 1:
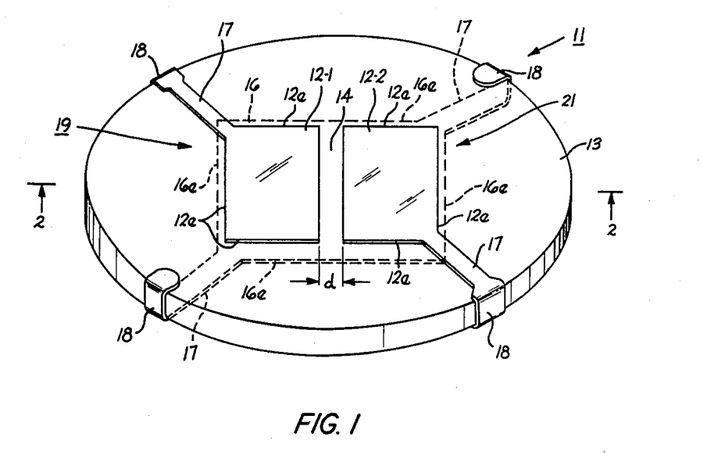
FIG. 1 is an isometric view of a monolithic crystal filter which may be fabricated in accordance with this invention.
Figure 2:
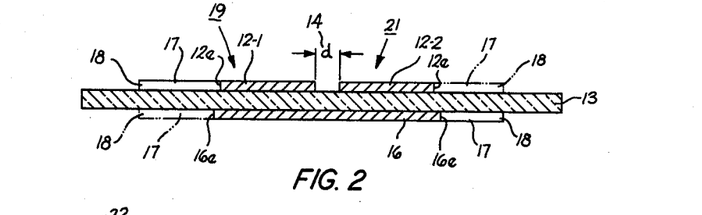
FIG. 2 is a cross-sectional view of the monolithic crystal filter shown in FIG. 1.

Referring to FIGS. 1 and 2, a high frequency monolithic crystal filter 11 of a known type which may be fabricated in accordance with the disclosed embodiment of the invention has a pair of first and second split electrodes (e.g., gold) 12-1 and 12-2 vapor deposited or otherwise plated on one side of a circular AT-cut quartz crystal body or wafer 13 so as to be separated a distance d by a narrow gap 14 therebetween. A solid electrode 16 is similarly vapor deposited or otherwise plated on an opposite side of the crystal wafer 13 so that the split electrodes 12 and the solid electrode are in superimposed relationship. The solid electrode 16 has peripheral edges 16e which either are aligned with, or are located beyond, corresponding edge portions 12e of the pair of split electrodes 12. In this connection, the peripheral edge portions 16e of the solid electrode 16 preferably are located beyond the corresponding edge portions 12e of the pair of split electrodes 12, as shown in FIGS. 1 and 2, to eliminate edge alignment and masking problems in the fabrication of the electrodes.

Leads 17 of each of the electrodes 12 and 16 are plated on its associated side of the circular crystal wafer 13 and extend to the peripheral edge of the wafer where they merge into terminals 18. The terminals 18 extend around an adjacent edge portion of the crystal wafer 13 to the opposite side of the wafer, thereby making the terminals available to electrical probes (not shown) for contact from either side of the wafer.

The pair of split electrodes 12-1 and 12-2 and respective portions of the solid electrode 16 form two resonators 19 and 21 with the crystal wafer 13. Thus, a high frequency potential (not shown) applied across either of the electrodes 12 (e.g., 12-1) and its associated portion of the solid electrode 16 will piezoelectrically generate thickness shear mode vibrations in the crystal wafer 13. The vibratory energy in the crystal wafer 13 between the first electrode 12 (e.g., 12-1) and its associated portion of the solid electrode 16 then establishes a varying electrical field at the output of the other electrode 12 (e.g., 12-2) and its associated portion of the solid electrode 16. The diameter and thickness of the crystal wafer 13, size of the electrodes 12 and 16 and the size (i.e., distance d) of the gap 14 between the electrodes 12 vary depending on the values of resonator coupling and midband frequency desired in the monolithic crystal filter 11, and are selected for this purpose using empirical data generated by measuring a plurality of representative sample parts in a manner known to those skilled in the art.

Figure 3:
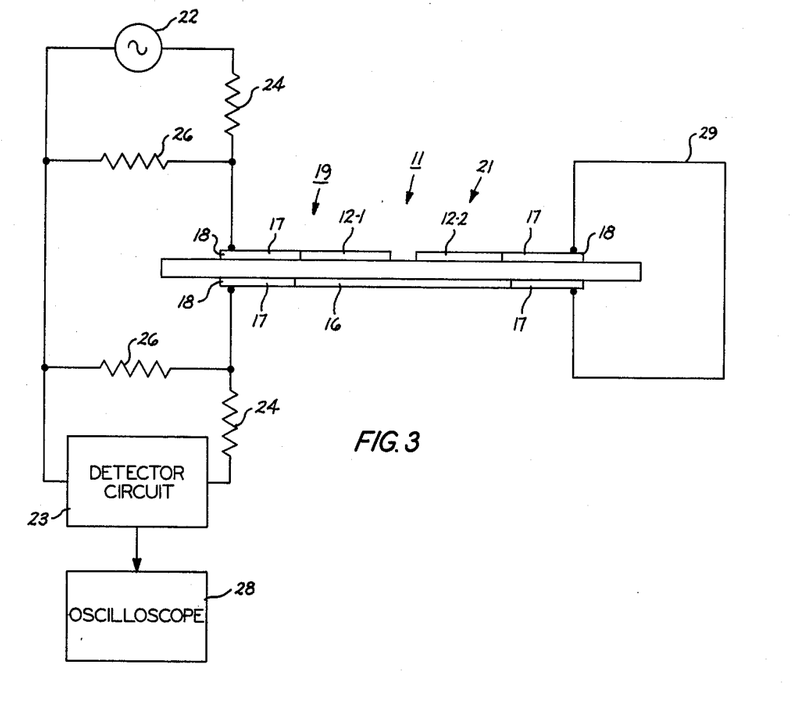
FIG. 3 is a schematic representation of a circuit for determining the resonator coupling of the monolithic crystal filter shown in FIG. 1.
Figure 4:
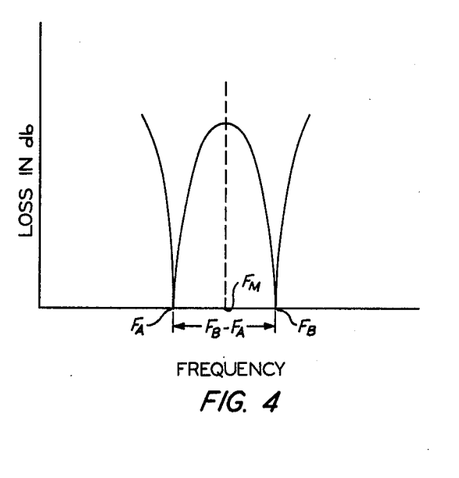
FIG. 4 is a graph illustrating a transmission characteristic curve of a monolithic crystal filter as shown in FIG. 1, obtained with the circuit of FIG. 3.

Referring to FIG. 3, a circuit of a known type for determining the resonator coupling and midband or center frequency of the monolithic crystal filter 11 includes a high frequency generator 22, a detector circuit 23, a pair of series resistors 24, a pair of shunt resistors 26 and an oscilloscope 28. The frequency generator 22, the detector circuit 23 and the resistors 24 are connected in series with one of the split electrodes 12 (e.g., 12-1), its associated portion of the solid electrode 16 and the intervening portion of the crystal wafer 13. The other split electrode 12 (e.g., 12-2) is short-circuited to its associated portion of the solid electrode 16 by a lead 29. When the frequency generator 22 applies a drive voltage to the first electrode 12-1, the resultant waveform, as disclosed in FIG. 4, is displayed on the oscilloscope 28. The points at which the curve intersects the X-axis in FIG. 4 and designated $F_A$ and $F_B$, represent the short circuit resonant frequencies of the resonators 19 and 21, respectively. The difference between these two frequencies $F_B-F_A$, is equal to the filter resonator coupling. The value of frequency located centrally between $F_B$ and $F_A$ and designated $F_M$, which is equal to $(F_B + F_A)/2$, represents the filter midband or center frequency of the filter 11.

Figure 5:
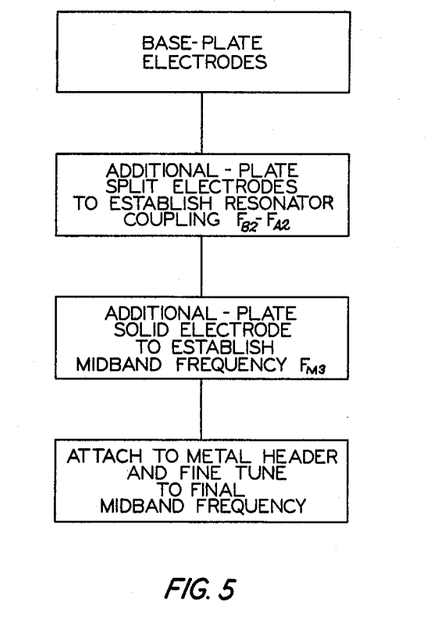
FIG. 5 is a chart illustrating a sequence of steps in carrying out the subject invention.
Figure 7A:
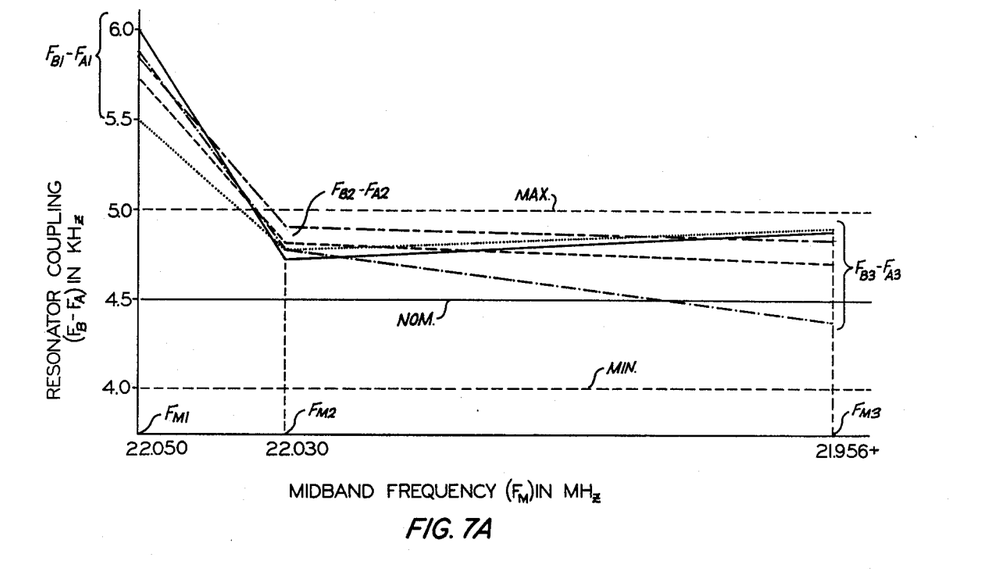
FIGS. 7A, B and C are graphs illustrating changes in resonator coupling and midband frequency of a plurality of monolithic crystal filters of the type shown in FIG. 1 during successive processing steps in accordance with the subject invention.

In accordance with this invention, referring to FIGS. 4 and 5, in fabricating one of the monolithic crystal filters 11 having a wide resonator coupling $F_B-F_A$ (e.g., 4 KHz or above) and a high midband frequency $F_M$ (e.g., 20 MHz or above), after uniform base-plating of the pair of split electrodes 12 and the solid electrode 16, additional electrode material is uniformly plated onto the pair of split electrodes and then uniformly plated onto the solid electrode in that order, to establish values of filter resonator coupling and midband frequency in sequence. In this connection, as is best shown in FIGS. 7A, B and C, it has been discovered that when the pair of split electrodes 12 and the solid electrode 16 are plated sequentially in this manner, the resonator coupling $F_B-F_A$ of the monolithic crystal filter 11 progressively decreases during the plating onto the pair of split electrodes. However, the resonator coupling $F_B-F_A$ subsequently remains essentially constant within tolerance limits, during the plating onto the solid electrode 16, whereby the necessity for a laser-trimmable resonator coupling-and-adjusting strip between the pair of split electrodes 12, as is disclosed in the I. E. Fair et al. U.S. Pat. No. 3,573,672 discussed herein under the heading "Description of the Prior Art," is not necessary.

More specifically, initially the pair of split electrodes 12 and the solid electrode 16, and their associated leads 17 and terminals 18, are base-plated onto opposite sides of the crystal wafer 13 in a suitable base-plating apparatus in a known manner. The amount of electrode material deposited on the electrodes 12 and 16 is such as to produce a filter device having an initial resonator coupling $F_{B1}-F_{A1}$ and a midband frequency $F_{M1}$, as illustrated by the solid line waveform in FIG. 6A. The initial resonator coupling $F_{B1}-F_{A1}$ is wider than a desired resonator coupling $F_{B3}-F_{A3}$, as illustrated by the solid line curve in FIG. 6C, and the initial midband frequency $F_{M1}$ is greater than a desired midband frequency $F_{M3}$. In this regard, in the disclosed embodiment of the invention, the resonator coupling $F_{B3}-F_{A3}$ desired when additional-plating of the solid electrode 16 is completed, is a nominal value, within minimum and maximum tolerance limits, as illustrated in FIGS. 7A, B and C. The desired midband frequency $F_{M3}$ is a value slightly above (e.g., 0.5 to 2.0 KHz) a final desired midband frequency, to avoid the possibility of the midband frequency decreasing below a final required value (in which case the filter would have to be discarded) when the monolithic crystal filter 11 is subsequently attached or "floated" to a metal header (not shown). As in the case of the structural design parameters of the monolithic crystal filter 11, the initial values of the midband frequency $F_{M1}$ and the resonator coupling $F_{B1}-F_{A1}$ are selected based on empirical data prepared by measuring a plurality of sample parts.

After the base-plating operation has been completed, the crystal wafer 13 may be mounted, along with a plurality of other base-plated crystal wafers, in a suitable plating apparatus, such as the vapor deposition apparatus (not shown) disclosed in the U.S. Pat. No. 3,864,161 to E. C. Thompson. In this apparatus the terminals 18 on the crystal wafer 13 are engaged by suitable probes to connect the electrodes 12 and 16 electrically to the circuit which is shown schematically in FIG. 4 and which is incorporated into the apparatus in a suitable manner.

Figure 6A:
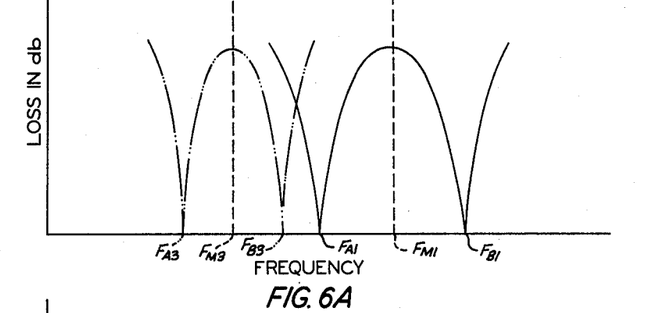
FIGS. 6A, B and C are graphs showing a series of transmission characteristic curves of the monolithic crystal filter of FIG. 1 as the filter is processed in successive steps in accordance with the subject invention.
Figure 6B:
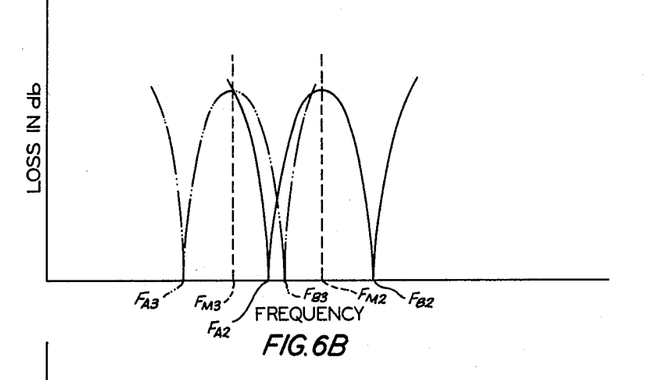

The solid line waveform in FIG. 6A, which illustrates the initial resonant frequencies $F_{A1}$ and $F_{B1}$ of the resonators 19 and 21 (FIGS. 1 and 2), then is displayed on a screen of the oscilloscope 28 (FIG. 3). Additional electrode material now is uniformly deposited on the split electrodes 12 (FIGS. 1 and 2) in the vapor deposition apparatus, in a series of successive plating steps, if necessary, until the initial resonator coupling $F_{B1}-F_{A1}$ has been narrowed to a value essentially equal to the desired resonator coupling $F_{B3}-F_{A3}$. The curve as displayed on the oscilloscope will then have a configuration as shown by the solid line curve in FIG. 6B. At this time, while the values of the resonator resonant frequencies, designated $F_{A2}$ and $F_{B2}$ on that curve, are greater than the desired frequency values $F_{A3}$ and $F_{B3}$, the difference between both sets of values is essentially the same. Further, the configuration of the solid line curve representing the resonator coupling $F_{B2}-F_{A2}$ in FIG. 6B is essentially identical in configuration to the curve representing the desired resonator coupling $F_{B3}-F_{A3}$ and shown in broken lines in FIG. 6B and in solid lines in FIG. 6C.

In narrowing the initial resonator coupling $F_{B1}-F_{A1}$ to the value $F_{B2}-F_{A2}$ (which corresponds to the desired resonator coupling $F_{B3}-F_{A3}$), the operating range of the oscilloscope 28 for any particular frequency setting frequently will not be sufficient to permit the narrowing of the resonator coupling to be accomplished in a single step and it is necessary to accomplish this operation in a series of successive steps as noted hereinabove. By way of illustration, the screen center frequency of the oscilloscope 28 may initially be set to a first intermediate frequency value between the short circuit resonant frequency values $F_{A1}$ and $F_{A3}$ of the resonator 19. With the oscilloscope in an automatic sweep frequency mode, additional electrode material then is uniformly deposited on the split electrodes 12 until the initial short circuit resonant frequency values $F_{A1}$ has been decreased to the intermediate frequency value. The additional-plating operation then is temporarily interrupted. The oscilloscope 28 now is placed in a manual operating mode and the resonator short circuit resonant frequencies, as indicated by the low points of the transmission characteristic curve (FIG. 4) on the oscilloscope screen, are measured and the then-existing resonator coupling is determined.

Assuming that the then-existing resonator coupling is not equal to (or substantially equal to) the desired resonator coupling $F_{B3}-F_{A3}$, the screen center frequency of the oscilloscope 28 is set to a new intermediate frequency value and additional-plating of the split electrodes 12 is continued until the short circuit resonant frequency of the resonator 19 has been decreased to this value. This sequence of steps is repeated, as necessary, until the desired resonator coupling $F_{B3}-F_{A3}$, as represented by the values of the frequencies $F_{B2}$ and $F_{A2}$ in FIG. 6B, has been reached. During the additional-plating of the split electrodes 12 to establish the resonator coupling $F_{B2}-F_{A2}$, the initial midband frequency $F_{M1}$ of the monolithic crystal filter 11 also decreases from its initial value to an intermediate value $F_{M2}$, as is shown in FIG. 6B and FIGS. 7A, B and C.

The monolithic crystal filter 11 next is removed from the vapor-deposition apparatus, inverted, and replaced in the apparatus for additional-plating onto the solid electrode 16. An additional electrode material is uniformly deposited on the solid electrode 16, the waveform representing the resonator coupling of the monolithic crystal filter 11, as shown by the solid line curve in FIG. 6B, is monitored on the screen of the oscilloscope 28 until the short circuit resonant frequency of the resonator 19 has decreased to the desired value $F_{A3}$ as shown by the broken-line waveform in FIG. 6B and by the corresponding solid-line waveform in FIG. 6C. The additional-plating of the solid electrode 16 is then stopped. At the same time, as is apparent from FIGS. 7A, B and C, since the resonator coupling, as represented by the difference in the frequency values $F_{B2}$ and $F_{A2}$, remains essentially unchanged during the additional-plating of the solid electrode 16, the midband frequency of the filter 11 also decreases from the intermediate value $F_{M2}$ to the desired value $F_{M3}$ as shown in these figures.

The monolithic crystal filter 11 next is removed from the vapor deposition apparatus and the terminals 18 are attached or "floated" to a metal header (not shown). The filter 11 then is fine-tuned to its final midband frequency $F_M$ (FIG. 4) by additional-plating onto each split electrode 12 in a separate facility (not shown) to balance the resonators 19 and 21 at the final midband frequency. During this final plating on the split electrodes 12 in the fine-tuning operation, the change in midband frequency is minimal so that the effect on the resonator coupling $F_{B3}-F_{A3}$ is insignificant.

Figure 7B:
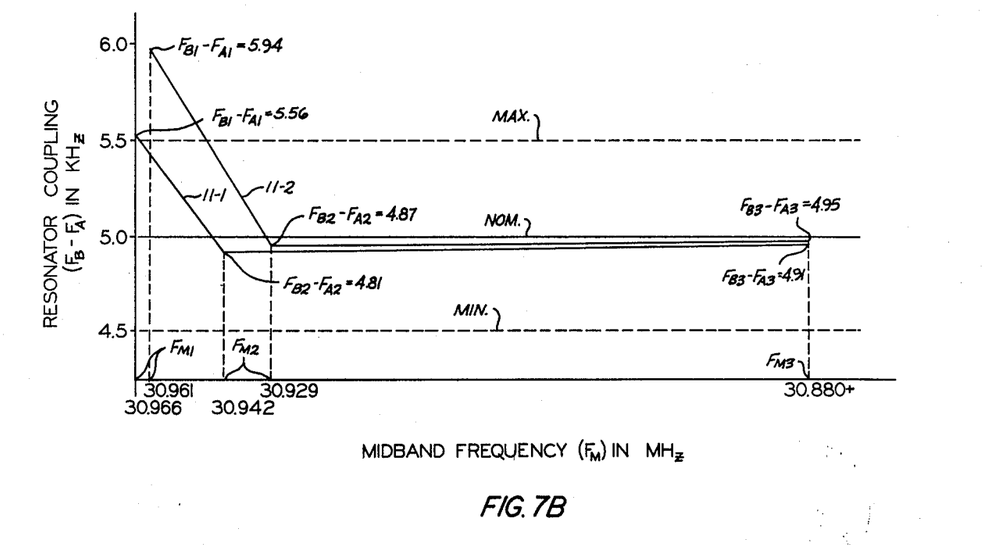
Figure 7C:
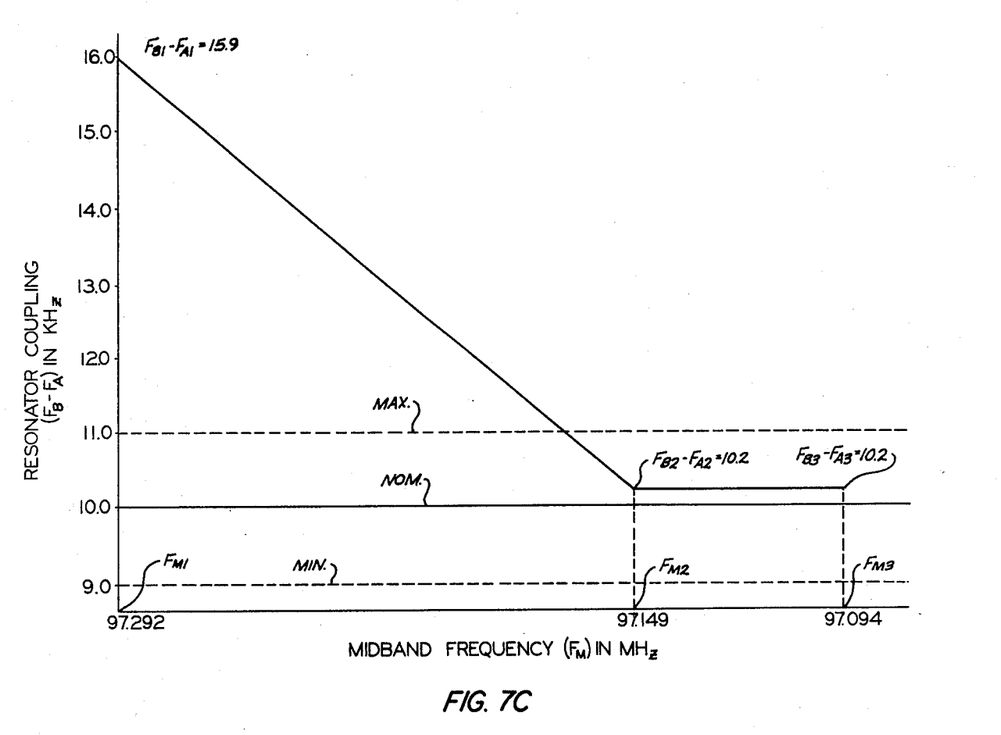

Referring to FIGS. 7A, B and C, as has been noted hereinabove, during the additional-plating of the split electrodes 12 the resonator coupling decreases substantially in proportion to its initial value $F_{B1}-F_{A1}$ and at a rapid rate. However, during the additional-plating of the solid electrode 16 to decrease the midband frequency to the value $F_{M3}$, the resonator coupling, as represented by the value $F_{B2}-F_{A2}$, remains essentially constant, within tolerance limits. In this connection, while the resonator coupling may widen slightly, or narrow further, during the additional-plating of the solid electrode 16, the rate and amount of change is generally insignificant. However, to help preclude the possibility of the resonator coupling going outside tolerance limits if the amount of additional-plating onto the solid electrode is excessive, the value of the initial midband frequency $F_{M1}$ preferably is chosen so that the major decrease in the midband frequency will occur during the additional-plating of the split electrodes 12 to establish the value of the desired resonator coupling $F_{B3}-F_{A3}$ (i.e., $F_{B2}-F_{A2}$), as is shown in FIG. 7C.

With more specific reference to FIG. 7A, there is shown a graph illustrating generally the changes in resonator coupling and midband frequency for five monolithic crystal filters 11 (FIGS. 1 and 2) having a desired final resonator coupling $F_{B3}-F_{A3}$ of 4.5 KHz ± 0.5 KHz, a desired final midband frequency $F_M$ of 21.956 MHz, and a gap distance d between the pair of split electrodes 12 of 30 mils. Each of the filters 11 had an initial resonator coupling $F_{B1}-F_{A1}$ after base-plating in a range on the order of 5.5 to 6.0 KHz, at an initial midband frequency $F_{M1}$ of 22.050 MHz. Additional electrode material then was uniformly plated on the split electrodes 12 of each of the filters 11 to narrow its initial resonator coupling $F_{B1}-F_{A1}$ to a value $F_{B2}-F_{A2}$ on the order of 4.7−4.9 KHz, in the upper portion of the acceptable tolerance range, for an average decrease of approximately 16%. At the same time, the midband frequency of each of the filters 11 decreased to a value $F_{M2}$ on the order of 22.030 MHz.

With further reference to FIG. 7A, additional electrode material then was deposited on the solid electrode 16 of each of the filters 11 until the midband frequency $F_{M2}$ had been decreased to a value $F_{M3}$ slightly above the final desired value of 21.956 MHz. During this plating step the resonator coupling of two of the filters 11 (solid and dotted lines) rose slightly to values $F_{B3}-F_{A3}$ on the order of 4.9 KHz, for increases of approximately 2%. The resonator coupling of two other filters 11 (long-short dash and short dash lines) continued to decrease, but at a greatly reduced rate on the order of 1½ and 3%, respectively. In the most extreme case (dot-dash line) the resonator coupling decreased from 4.76 KHz to 4.39 KHz, a decline of 8%, but still within the acceptable tolerance limits.

FIG. 7B illustrates changes in resonator coupling and midband frequency for two monolithic crystal filters 11-1 and 11-2 having a desired resonator coupling $F_{B3}-F_{A3}$ of 5.0 KHz ± 0.5 KHz, a final midband frequency $F_M$ of 30.880 MHz and a gap distance d (FIGS. 1 and 2) between the pair of split electrodes 12 of 14 mils. In the additional-plating of the split electrodes 12 of the filter 11-1, the initial resonator coupling $F_{B1}-F_{A1}$ was narrowed from a value of 5.56 KHz to a value of 4.81 KHz, a decrease on the order of 13%. At the same time the midband frequency $F_{M1}$ decreased from an initial value of 30.966 MHz to 30.942 MHz. Similarly, in additional-plating of the split electrodes 12 of the filter 11-2, the initial resonator coupling $F_{B1}-F_{A1}$ decreased from 5.94 MHz to 4.87 MHz, a decline of 18%, and an initial midband frequency value $F_{M1}$ of 30.961 MHz decreased to a value 30.929 MHz. Then, during additional-plating of the solid electrodes 16 of the filters 11-1 and 11-2 to decrease the midband frequency $F_{M2}$ to a value $F_{M3}$ slightly above 30.880 MHz, the resonator couplings of the filters widened slightly on the order of 2% and 1%, respectively.

In FIG. 7C, one of the monolithic crystal filters 11 having a desired resonator coupling $F_B-F_A$ of 10.0 KHz ± 1.0 KHz, a midband frequency $F_M$ of 97.088 MHz and a gap distance d between the pair of split electrodes 12 of 5 mils, was additional-plated on its split electrodes 12 to reduce the initial resonator coupling $F_{B1}-F_{A1}$ from a value of 15.9 MHz to a resonator coupling value $F_{B2}-F_{A2}$ of 10.2 MHz, for a decrease on the order of 36%. To decrease the possibility of the resonator coupling going out of tolerance limits during the additional-plating of the solid electrode 16, an initial midband frequency $F_{M1}$ of 97.292 MHz was chosen so that the major portion of the decrease in midband frequency would be accomplished during the additional-plating of the split electrodes 12. As a result, during the additional-plating of the split electrodes 12 the initial midband frequency $F_{M1}$ decreased to a value $F_{M2}$ of 97.149 MHz. Then during additional-plating of the solid electrode 16, the resonator coupling remained unchanged.

While the foregoing sequence of steps, as illustrated in FIG. 5, is particularly adapted to the fabrication of monolithic crystal filters 11 having a high midband frequency $F_M$ (e.g., 20 MHz and above) and a wide resonator coupling $F_B-F_A$ (e.g., 4 KHz and above), the disclosed method also can be utilized in the fabrication of filters of lower frequency and narrower resonator coupling. Where the opposite faces of the crystal wafer 13 are essentially parallel to one another, the subject method can be utilized for this purpose as described hereinabove. If the degree of nonparallelism of the opposite faces of the crystal wafer 13 is excessive, however, the initial resonator coupling $F_{B1}-F_{A1}$, as measured utilizing the circuit of FIG. 3, will be less than the actual resonator coupling and the processing of the wafer must be slightly modified to compensate for this difference.

The degree of parallelism or nonparallelism of the opposite faces of the crystal wafer 13 may be measured in any suitable manner. For example, since the respective open circuit resonant frequencies of the resonators 19 and 21 formed by the electrodes 12 and 16 with the crystal wafer 13 are a function of the thicknesses of the respective portions of the wafer which form the resonators, the parallelism of the crystal wafer faces may be determined electrically, such as by measuring the open circuit resonant frequencies utilizing the circuit shown in FIG. 3, with the short-circuiting lead 29 removed. The difference in the measured open circuit resonant frequencies then can be utilized to determine whether the process should be modified to compensate for the nonparallelism of the faces of the crystal wafer 13. Where the crystal wafer 13 is of the polished type normally used for overtone frequencies, the nonparallelism of the wafer faces also may be measured using a monochromatic light source and the difference in the open circuit resonant frequencies then can be determined utilizing empirical data, not shown.

Figure 8:
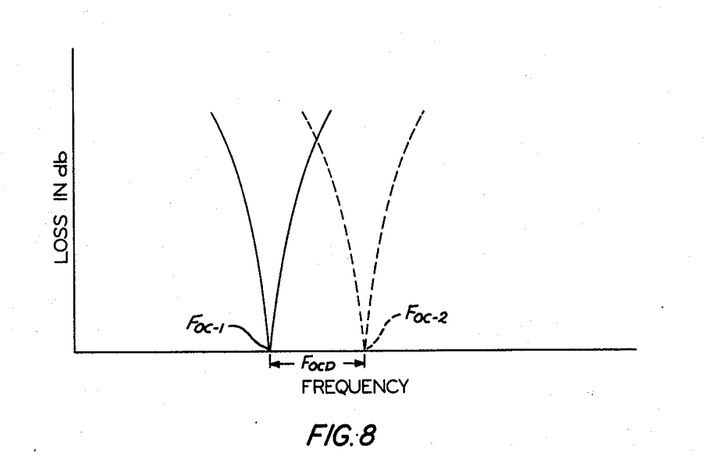
FIG. 8 is a graph illustrating transmission characteristic curves of a monolithic crystal filter as shown in FIG. 1, obtained with a modified circuit of the type shown in FIG. 3.

With reference to the circuit shown in FIG. 3, when the lead 29 for short-circuiting the second one of the split electrodes 12-2 to the solid electrode 16 is removed, the second electrode and the solid electrode are open-circuited with respect to each other. The resultant waveform which then appears on an oscilloscope 28 is shown, for example, by the solid line curve in FIG. 8. The point at which the curve intersects the X-axis, designated $F_{OC-1}$, is representative of the open circuit resonant frequency of the resonator 19 formed by the first split electrode 12-1 and the solid electrode 16 with the crystal wafer 13. An open circuit resonant frequency $F_{OC-2}$ of the second resonator 21 then can be determined in the same manner by reversing the crystal wafer 13 in the modified circuit so that the resonator 21 is connected into the circuit and the resonator 19 is open-circuited. This produces another waveform on the oscilloscope, as for example, shown in FIG. 8 by the curve in broken lines, with the point at which the curve intersects the X-axis representing the open circuit resonant frequency of the resonator 21. The difference $F_{OCD}$ between the open circuit resonant frequencies $F_{OC-1}$ and $F_{OC-2}$ then can readily be determined.

Where the degree of parallelism of the opposite faces of the crystal wafer 13 is such that the difference $F_{OCD}$ between the open circuit resonant frequencies $F_{OC-1}$ and $F_{OC-2}$ of the resonators 19 and 21 is within a preselected tolerance range, such as less than 10% of the desired resonator coupling $F_B - F_A$, the difference between the measured resonator coupling and the actual resonator coupling will be insignificant and can be ignored. Thus, the method of fabricating the monolithic crystal filter 11 as above described may be utilized without any adjustment in the process.

However, where the difference $F_{OCD}$ between the open circuit resonant frequencies $F_{OC-1}$ and $F_{OC-2}$ of the resonators 19 and 21 is greater than the preselected tolerance range, such as 10% of the desired resonator coupling $F_B - F_A$, the discrepancy in the measured resonator coupling and the actual resonator coupling may result in the final resonator coupling of the monolithic crystal filter 11 being too narrow and not within permissible tolerance limits. Accordingly, it is necessary to compensate for this nonparallelism in a suitable manner. For example, the split electrodes 12 may initially be plated individually in the apparatus of the E. C. Thompson U.S. Pat. No. 3,864,161 to balance the resonators 19 and 21 at a preselected frequency slightly below the initial resonator frequencies $F_{A1}$ and $F_{A2}$. Then, the split electrodes 12 and the solid electrode 16 may be plated in sequence as above described. In the alternative, the measuring of the open circuit resonant frequency difference may be omitted and the resonators 19 and 21 of each crystal filter 13 may be prebalanced to the preselected frequency directly, if so desired.

In the disclosed embodiment of the invention, the determination as to when the desired values of resonator coupling $F_{B3} - F_{A3}$ and midband frequency $F_{M3}$ have been reached, are determined manually utilizing the circuit of FIG. 3, including the oscilloscope 28. However, it also is considered to be within the purview of the invention to accomplish these determinations automatically, as for example utilizing suitable computer controlled and programmed apparatus for this purpose.

Figure 6C:
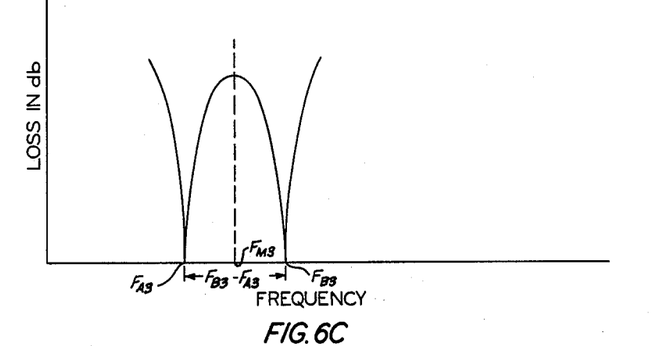

In summary, a new and improved method of fabricating the monolithic crystal filter 11 as shown in FIGS. 1 and 2 has been disclosed. With reference to FIGS. 5, 6 and 7, the method involves initially base-plating the pair of split electrodes 12 and the solid electrode 16, together with their respective leads 17 and terminals 18, on opposite sides of the crystal wafer 13. The amount of material that is base-plated in forming the electrodes 12 and 16 is such as to produce a filter device in which the initial coupling $F_{B1} - F_{A1}$ between the resonators 19 and 21 is wider or greater than the desired resonator coupling $F_{B3} - F_{A3}$ and in which the initial midband frequency $F_{M1}$ is greater than the value desired for the midband frequency $F_{M3}$. Additional electrode material then is uniformly plated on the pair of split electrodes 12 to decrease or narrow the resonator coupling to the value $F_{B2} - F_{A2}$, which is essentially equal to the desired value $F_{B3} - F_{A3}$. Additional electrode material next is uniformly plated on the solid electrode 16 to establish the value of midband frequency $F_{M3}$, which preferably is slightly above the final value desired. Then, after attachment of the filter 11 to its metal header (not shown), the filter 11 is fine-tuned to its final midband frequency.

With specific reference to FIGS. 7A, B and C, when the electrodes 12 and 16 are plated in this sequence the initial resonator coupling $F_{B1} - F_{A1}$ decreases substantially in proportion to its initial base-plated value during the additional-plating of the split electrodes 12. At the same the initial midband frequency $F_{M1}$ also decreases to the value $F_{M2}$. Subsequently, however, during the additional-plating of the solid electrode 16 to decrease the midband frequency $F_{M2}$ further to the value $F_{M3}$, the resonator coupling $F_{B2} - F_{A2}$ remains essentially constant, within tolerance limits, as the resonant frequencies $F_{B2}$ and $F_{A2}$ decrease to the values $F_{B3}$ and $F_{A3}$, respectively, whereby the resonator couplings represented by $F_{B2} - F_{A2}$ and $F_{B3} - F_{A3}$ are essentially equal. Thus, the need for providing a laser-trimmable resonator coupling-and-adjusting strip between the split electrodes 12 of a type presently used in the manufacture of monolithic crystal filters having a low midband frequency and resonator coupling, is eliminated. This is advantageous, particularly in the manufacture of the monolithic crystal filters 11 having a high midband frequency $F_M$, wide resonator coupling $F_B - F_A$ and a narrow (e.g., 30 mils or less) gap 14 between the electrodes, in which the resonator coupling-and-adjusting strip would be difficult, and in certain instances impossible, to fabricate. The disclosed method also is advantageous since it eliminates the need for a laser or other type apparatus for trimming of a resonator coupling-and-adjusting strip between the electrodes 12.

While the disclosed method is particularly suited for the fabrication of monolithic crystal filters 11 having high midband frequencies $F_M$ (e.g., 20 MHz or above) and wide resonator couplings $F_B - F_A$ (e.g., 4 KHz or above), it also can be utilized in the fabrication of filters having lower midband frequencies and narrower couplings if the opposite faces of the crystal wafer 13 are essentially parallel within limits. The parallelism of the opposite faces of the crystal wafer 13 can be determined by measuring the open circuit resonant frequency difference $F_{OCD}$ between the resonators 19 and 21. If it is determined that the opposite faces of the crystal wafer 13 are not sufficiently parallel, the disclosed method still can be utilized to process the wafer, as for example, by first additional-plating the split electrodes 12 individually to prebalance the resonators 19 and 21 to the same resonant frequency. In the alternative, the resonators 19 and 21 may be prebalanced directly, without measuring the open circuit resonant frequency difference $F_{OCD}$, if so desired.

What is claimed is:

1. The method of manufacturing a monolithic crystal filter, which comprises the sequential steps of:
   plating electrode material onto opposite sides of a crystal wafer to form a pair of split electrodes on one side of the wafer and a solid electrode on the other side of the wafer in superimposed relationship, to produce a device having an initial resonator coupling greater than a desired resonator coupling and having an initial midband frequency above a desired midband frequency;

plating additional electrode material onto the pair of split electrodes to narrow the initial resonator coupling of the device to a desired resonator coupling and to decrease the frequency of the device from the initial midband frequency to an intermediate midband frequency which is below the initial midband frequency and above the desired midband frequency; and plating additional electrode material onto the solid electrode to decrease the midband frequency of the device from the intermediate midband frequency to the desired midband frequency.

2. The method as recited in claim 1, in which the monolithic crystal filter is to have a final midband frequency on the order of 20 MHz or above and a final resonator coupling on the order of 4 KHz or above.

3. The method as recited in claim 1 in which the split electrodes are plated on the crystal wafer with a gap of 30 mils or less between the split electrodes.

4. The method as recited in claim 1 in which the split electrodes are plated on the crystal wafer with a gap of 5–30 mils between the split electrodes.

5. The method as recited in claim 1 in which the major portion of the decrease in the midband frequency is accomplished during the additional-plating of the pair of split electrodes to establish the desired resonator coupling.

6. The method as recited in claim 1 in which the solid electrode has edges which extend outwardly beyond corresponding edges of the split electrodes.

7. The method as recited in claim 1, wherein the split electrodes and the solid electrode form first and second resonators with the crystal wafer, and which further comprises:

plating additional material onto the pair of split electrodes individually to prebalance the first and second resonators at a selected frequency below the initial midband frequency prior to plating additional material onto the split electrodes and the solid electrode in sequence to establish the desired resonator coupling and midband frequency, respectively.

8. The method as recited in claim 1, which further comprises:

measuring the difference in open circuit resonant frequencies of first and second resonators of the base-plated crystal wafer; and plating additional material onto the pair of split electrodes individually to prebalance the first and second resonators at a selected frequency below the initial midband frequency prior to plating additional material onto the split electrodes and the solid electrode to establish the desired resonator coupling and midband frequency, respectively, when the difference between the open circuit resonant frequencies exceeds a preselected tolerance limit.

9. The method as recited in claim 8, in which the monolithic crystal filter is to have a final midband frequency of less than 20 MHz and a final resonator coupling of less than 4 KHz.

10. The method as recited in claim 9, in which the maximum preselected tolerance difference between the open circuit resonant frequencies is 10% of the final resonator coupling of the filter.

* * * * *